(12) United States Patent
Kim (10) Patent No.: US 11,528,560 B2
(45) Date of Patent: Dec. 13, 2022

(54) HYBRID MOVABLE COIL PLATE AND FLAT PLATE-TYPE SPEAKER USING SAME

(71) Applicants: Dong-Man Kim, Seoul (KR); Chongqing XinPing Semiconductor Co., Ltd., Chongqing (CN)

(72) Inventor: Dong-Man Kim, Seoul (KR)

(73) Assignees: Dong-Man Kim; Chongging XinPing Semiconductor Co., Ltd.

(*) Notice: Subject to any disclaimer, the term of this patent is extended or adjusted under 35 U.S.C. 154(b) by 126 days.

(21) Appl. No.: 16/980,093

(22) PCT Filed: Mar. 7, 2019

(86) PCT No.: PCT/KR2019/002664
§ 371 (c)(1),
(2) Date: Sep. 11, 2020

(87) PCT Pub. No.: WO2019/177307
PCT Pub. Date: Sep. 19, 2019

(65) Prior Publication Data
US 2021/0029466 A1    Jan. 28, 2021

(30) Foreign Application Priority Data
Mar. 12, 2018 (KR) .................. 10-2018-0028501

(51) Int. Cl.
*H04R 9/06* (2006.01)
*H04R 9/04* (2006.01)
(Continued)

(52) U.S. Cl.
CPC ................ *H04R 9/046* (2013.01); *H01F 7/02* (2013.01); *H01F 7/081* (2013.01); *H04R 1/06* (2013.01);
(Continued)

(58) Field of Classification Search
CPC .......... H04R 1/06; H04R 9/025; H04R 9/046; H04R 9/047; H04R 9/06; H04R 2209/041; H05K 1/115; H05K 1/165
See application file for complete search history.

(56) References Cited

U.S. PATENT DOCUMENTS

| 3,873,784 A * | 3/1975 | Doschek | ............... H04R 9/047 |
| | | | 381/186 |
| 8,953,834 B2 * | 2/2015 | Kim | ...................... H04R 9/047 |
| | | | 381/431 |

(Continued)

FOREIGN PATENT DOCUMENTS

| EP | 2408219 A1 | 1/2012 |
| KR | 10-0576268 B1 | 4/2006 |

(Continued)

OTHER PUBLICATIONS

International Search Report from PCT/KR2019/002664, dated Jul. 8, 2019, pp. 1-4, including English translation.

(Continued)

*Primary Examiner* — Huyen D Le
(74) *Attorney, Agent, or Firm* — The Belles Group, P.C.

(57) ABSTRACT

The present invention relates to a hybrid movable coil plate and a flat panel speaker, and more particularly, to a hybrid movable coil plate and a flat panel speaker which have improved acoustic pressure of the speaker by attaching a coil pattern printed on one surface of the movable coil plate and a copper wire coil wound on the other surface to increase inductive electromotive force. A hybrid movable coil plate for a flat panel speaker is characterized by including a spirally wound copper wire coil attached on one surface thereof and a PCB coil pattern-printed on the other surface thereof, wherein the copper wire coil and the PCB coil are formed in track shapes, a pair of lead wire connection ends are formed, and copper foils are formed in one or more via holes for electrical connection between the copper wire coil and the PCB coil, and in the vicinity of at least one among the one or more via holes.

7 Claims, 7 Drawing Sheets

(51) Int. Cl.
  *H01F 7/02*   (2006.01)
  *H01F 7/08*   (2006.01)
  *H04R 1/06*   (2006.01)
  *H05K 1/11*   (2006.01)
  *H05K 1/16*   (2006.01)

(52) U.S. Cl.
  CPC .............. *H04R 9/047* (2013.01); *H04R 9/06* (2013.01); *H05K 1/115* (2013.01); *H05K 1/165* (2013.01)

(56)              References Cited

U.S. PATENT DOCUMENTS

| | | |
|---|---|---|
| 2003/0103642 A1 | 6/2003 | Kam |
| 2003/0174856 A1* | 9/2003 | Johannsen ............. H04R 9/046 381/412 |
| 2013/0089232 A1 | 4/2013 | Kim |
| 2014/0168019 A1 | 6/2014 | Hirobe et al. |
| 2018/0295451 A1 | 10/2018 | Min et al. |

FOREIGN PATENT DOCUMENTS

| | | |
|---|---|---|
| KR | 10-20090104325 A | 10/2009 |
| KR | 10-2010-0094873 A | 8/2010 |
| KR | 10-2011-0135468 A | 12/2011 |
| KR | 10-2014-0060360 A | 5/2014 |
| KR | 1020150057230 A | 5/2015 |
| KR | 10-2016-0128530 A | 11/2016 |
| KR | 10-2017-0000873 A | 1/2017 |

OTHER PUBLICATIONS

European Supplementary Search Report from EP19768506, dated Dec. 6, 2021, pp. 1-19.

* cited by examiner

HYBRID MOVABLE COIL PLATE AND FLAT PLATE-TYPE SPEAKER USING SAME

CROSS-REFERENCE TO RELATED PATENT APPLICATIONS

The present application is a U.S. national stage application under 35 U.S.C. § 371 of PCT Application No. PCT/KR2019/002664, filed Mar. 7, 2019, which claims priority to Korean Patent Application No. 10-2018-0028501, filed Mar. 12, 2018. The disclosures of the aforementioned priority applications are incorporated herein by reference in their entireties.

TECHNICAL FIELD

The present invention relates to a hybrid movable coil plate and a flat panel speaker using the same, and more particularly, to a hybrid movable coil plate and a flat panel speaker using the same which have improved acoustic pressure of the speaker by attaching a pattern-printed coil on one surface of the movable coil plate and a copper wire coil wound on the other surface to increase inductive electromotive force.

BACKGROUND ART

A movable coil plate used for flat panel speakers is spirally wound or pattern-printed on a single surface or both surfaces of a plate-like coil base.

In the movable coil plate, when current flows through a movable coil, the current flowing at that time generates a magnetic field, which expands and shrinks at the same frequency as an audio signal, around the movable coil, and since the movable coil is subjected to the magnetic field generated by a magnet inside a speaker unit, the movable coil plate moves vertically while interacting with the magnetic field generated at the movable coil corresponding to the magnetic field, and since the movable coil plate is connected to a vibration plate of the speaker unit, the vibration plate push out air while moving vertically and generates a sound by the vibration of the air.

These flat panel speakers tend to be developed to have increased output capacity, gradually decreasing sizes, and long structures, and in order to increase the output capacity of the flat panel speakers, development of a flat panel speaker having a structure in which a plurality of magnetic circuits are coupled has emerged as an important issue.

In order to implement a flat panel speaker, a movable coil plate functioning as a bobbin for the movable coil is manufactured in a plate shape, and the movable coil is formed on both surfaces of the plate-like movable coil plate.

The movable coil has a shape in which a track-like coil wound around a bobbin is attached to a movable coil plate (Korean Patent No 10-0576268) or a shape in which a movable coil is pattern-printed like a PCB movable coil plate (Korean Patent Publication No. 10-2009-0104325).

Spirally wound copper wire movable coils each start at the outer periphery of a coil track and end at the inside of the coil track, so that positive and negative lead wires are very hardly connected to each other, and when a single thread of copper wire is wound, the number of turns of the rack should be increased to increase an "L" value, but there is a limitation in that impedance increases while the number of turns increases. In order to increase the number of turns while maintaining impedance, a thick copper wire should be wound, but in this case, inversely proportional correlation inconsistency occurs in that the thickness and weight of the entire movable coil increases while the number of turns increases.

In addition, in case of the pattern-printed PCB movable coil, two layers have to be connected in series in a two-layer structure coil track, and only with the serial connection, impedance proportionally increases by an amount of increase in the number of turns of the coil track. Thus, this is inefficient for impedance control.

Furthermore, when a planar coil track is printed on a PCB having a multilayer of four layers or more, it is possible to enhance efficiency by increasing the number of turns using a PCB fine process technique to increase an "L" value and enhance the efficiency by a serial or parallel combination between layers. However, a very wide distribution is formed in an aspect of impedance management due to the PCB fine process and the multilayer structure PCB, mass production efficiency is degraded and the cost for movable coil using the multilayer PCB increases, and thus, it is difficult to dramatically improve the component cost, and the process of precisely designing the PCB pattern-printed track and redesigning after modifying and improving the design result becomes complicated and requires much costs.

Prior Art Documents (Patent document 1) Korean Patent No. 10-0576268
(Patent document 2) Korean Patent Publication No. 10-2009-0104325

DISCLOSURE OF THE INVENTION

Technical Problem

The problem to be addressed by the present invention to solve the above-mentioned limitations is to provide a new-concept movable coil which is for flat panel speakers and is effective and functionally excellent by combining the merit of a spirally wound copper wire movable coil and the merit of a pattern-printed coil track.

Technical Solution

In order to solve the limitations, a hybrid movable coil plate for a flat panel speaker according to the present invention includes a spirally wound copper wire coil attached on one surface thereof and a PCB coil pattern printed on the other surface thereof, wherein the copper wire coil and the PCB coil are formed in track shapes and are electrically connected to each other through one or more via holes In addition, a hybrid movable coil plate for a flat panel speaker according to the invention includes a spirally wound copper wire coil attached on one surface thereof and a PCB coil pattern-printed on the other surface thereof, wherein the copper wire coil and the PCB coil are formed in track shapes, a pair of lead wire connection ends are formed, and copper foils are formed in one or more via holes for electrical connection between the copper wire coil and the PCB coil, and in the vicinity of at least one among the one or more via holes.

In addition, a hybrid movable coil plate for a flat panel speaker according to the present invention includes 2n+1 (n is a positive integer) layers, a copper wire coil having a spirally wound track shape attached on one surface of 2n−1th movable coil plate and a track-like PCB coil pattern-printed on the other surface thereof, wherein a pair of lead wire connection ends are formed on upper end both sides of the 2n−1th movable coil plate, copper foils are formed in one or more via holes for electrical connection between the copper wire coil and the PCB coil and in the vicinity of the one or more via holes, and a 2n-th movable coil plate includes a track-like PCB coil pattern-printed on the other surface thereof and one or more via holes.

In addition, a hybrid movable coil plate for a flat panel speaker according to the present invention includes 2n (n is a positive integer) layers, a copper wire coil having a spirally wound track shape attached on one surface of each of movable coil plates and a track-like PCB coil pattern-printed on the other surface thereof, wherein a pair of mutually facing movable coil plates each have a single lead wire connection end formed therein, a single via hole on the inner side thereof provided so that the PCB coil is connected thereto, and another via hole and a copper foil formed on the inner side thereof so that a pair of mutually facing copper wire coils are connected through the another via hole and the copper foil.

Here, an inner start end of the copper wire coil may be connected to an inner start end of the PCB coil through the via hole, the outer end of the copper wire coil may be electrically connected to the copper foil positioned on one side surface through the via hole, the outer end of the PCB coil may be connected to one lead wire connection end, and the copper plate positioned on the one side surface may be connected to the other lead wire connection end.

Here, the inner start end of the copper wire coil of the 2n−1th movable coil plate may be electrically connected to the inner start end of the PCB coil through the via hole, and the outer end of the copper wire coil may be electrically connected to a copper plate positioned on one side surface through the via hole; an inner start end of each of the PCB coils of the 2n-th movable coil plate may be connected through the via hole, and an outer end thereof is connected through another via hole; one lead wire of the 2n−1th movable coil plate and an outer end of the 2n+1th movable coil plate may be commonly connected, and the other lead wire of the 2n−1th movable coil plate and an outer end of the 2n-th movable coil plate may be commonly connected; and an outer end of the PCB coil of the 2n−1th movable coil plate may be connected to one lead wire connection end, and a copper plate positioned on the one side surface may be connected to the other lead wire connection end.

Here, a pair of mutually facing movable coil plates may each be connected with the inner start end of the PCB coil; the inner start ends of the copper wire coils may be connected to each other through the via hole and the copper plate; and an outer end of the 2n−1th movable coil plate may be commonly connected to one lead wire connection end, and an outer end of 2n-th movable coil plate may be commonly connected to the other lead wire connection end.

In addition, the panel speaker may include a hybrid movable coil plate of any one of claims 1 to 7.

In addition, a flat panel speaker includes a hybrid movable coil plate of any one of claims 1 to 7, wherein: a pair of magnetic bodies spaced apart a predetermined distance from each other are positioned on both sides of the movable coil plate; the pair of magnetic bodies each include a magnet, an upper yoke positioned on an upper surface of the magnet, and a lower yoke positioned on a lower surface of the magnet; and one of the upper yoke or the lower yoke has a flat plate shape, and the other has a bent shape bent about 90 degrees at a position facing the movable coil plate.

Advantageous Effects

According to the configuration of the present invention, there may be provided a new-concept movable coil, which is for flat panel speakers and is effective and functionally excellent by combining the merit of a spirally wound copper wire movable coil and the merit of a pattern-printed coil track.

In addition, it is possible to solve the difficulty in electrical connection of the inner and outer ends of a track of a planar copper wire movable coil spirally wound by a typical copper wire, and an "L" value which is very important to improve acoustic pressure may be maximized.

In addition, the number of turns of coil tracks pattern-printed on a PCB is added to the number of turns of copper wire movable coil and thus increases inductive electromotive force and improves the acoustic pressure of a speaker, and it is possible to effectively implement impedance control through a combination of a PCB pattern-printed movable coil and a copper wire movable coil.

MODE FOR CARRYING OUT THE INVENTION

Hereinafter, the structure and acting effect of a hybrid movable coil plate for a flat panel speaker according to the present invention will be described with reference to the accompanying drawings.

Detailed descriptions on specific embodiments illustrated in the accompanying drawings are associated with the accompanying drawings, and the drawings are considered as a portion about the descriptions of the entirety of the invention. The statement on directions or orientations are provided only for convenience of description, and do not have an intention of limiting the scope of the present invention.

Specifically, the terms indicating positions such as "under, on, horizontal, vertical, above, below, upward, downward, upper, and lower" or a derivative thereof (for example, "horizontally, downward, and upward") should be understood considering all descriptions related to the drawings in description. In particular, these relative words are provided only for convenience of description, and thus do not require that the apparatus of the present invention should be configured or operate in a specific direction.

In addition, unless stated otherwise, the terms indicating mutual coupling relationship between elements such as "mounted, attached, connected, linked and mutually connected" may mean a state in which individual elements are directly or indirectly attached, connected, or fixed, and this should be understood as the terms covering up to not only a state of being movably attached, connected or fixed, but also an unmovable state.

When reference numerals are assigned to the components in constituents in each of the drawings, it should be noted that the same components, although illustrated in different drawings, are allowed to have the same reference numerals if possible. Hereinafter, detailed descriptions related to well-known functions or configurations will be ruled out in order not to unnecessarily obscure subject matters of the present invention.

First Embodiment According to the Present Invention

Figure 1:
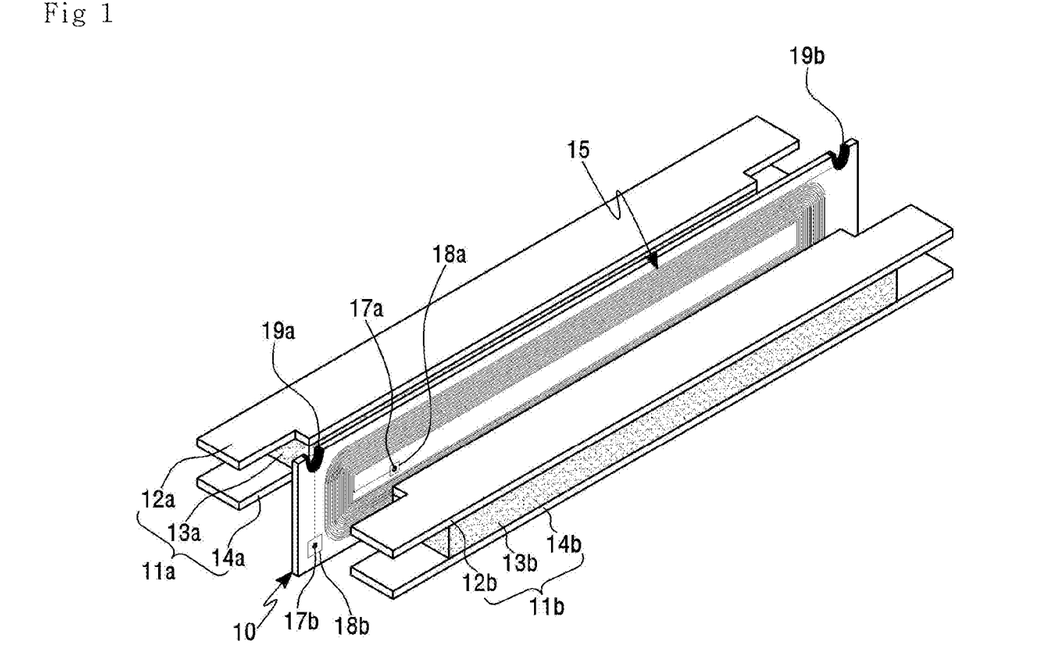
FIG. 1 is a schematic perspective view of a flat panel speaker including a hybrid movable coil plate according to a first embodiment of the present invention.
Figure 2:
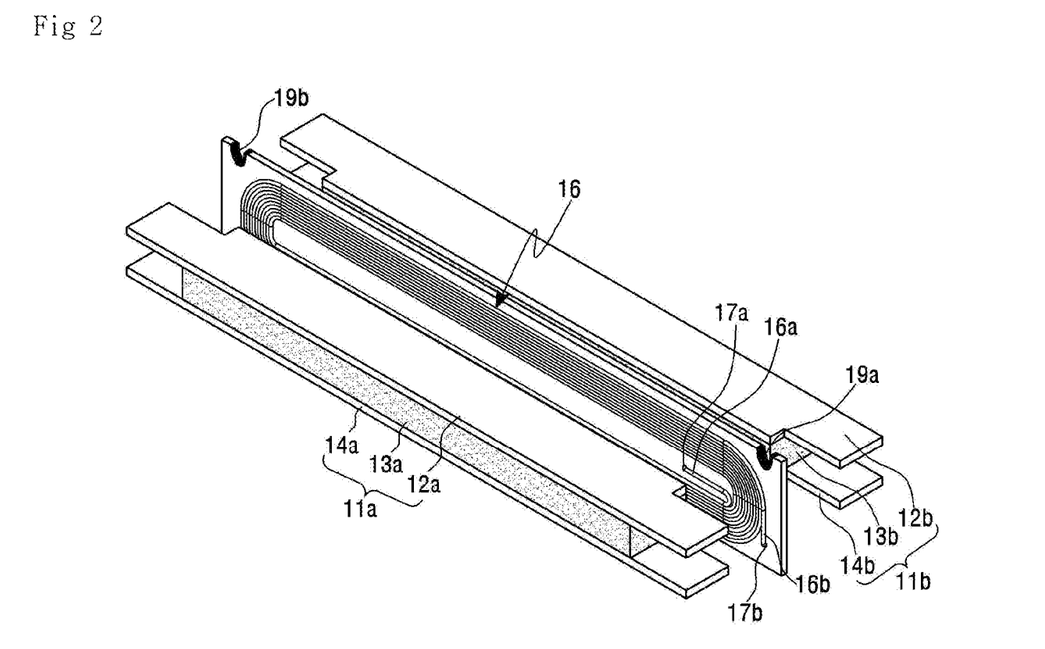
FIG. 2 is a schematic perspective view of a flat panel speaker including a hybrid movable coil plate viewed from another angle according to the first embodiment of the present invention.
Figure 3:
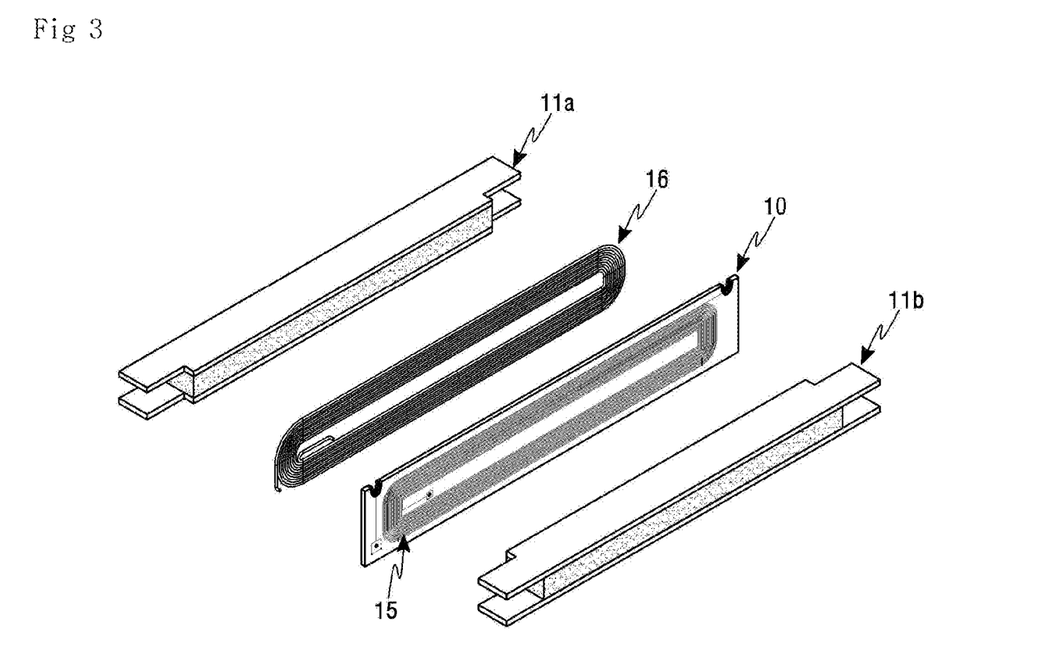
FIG. 3 is an exploded perspective view of a copper wire coil of a flat panel speaker including a hybrid movable coil plate according to the first embodiment of the present invention.
Figure 4:
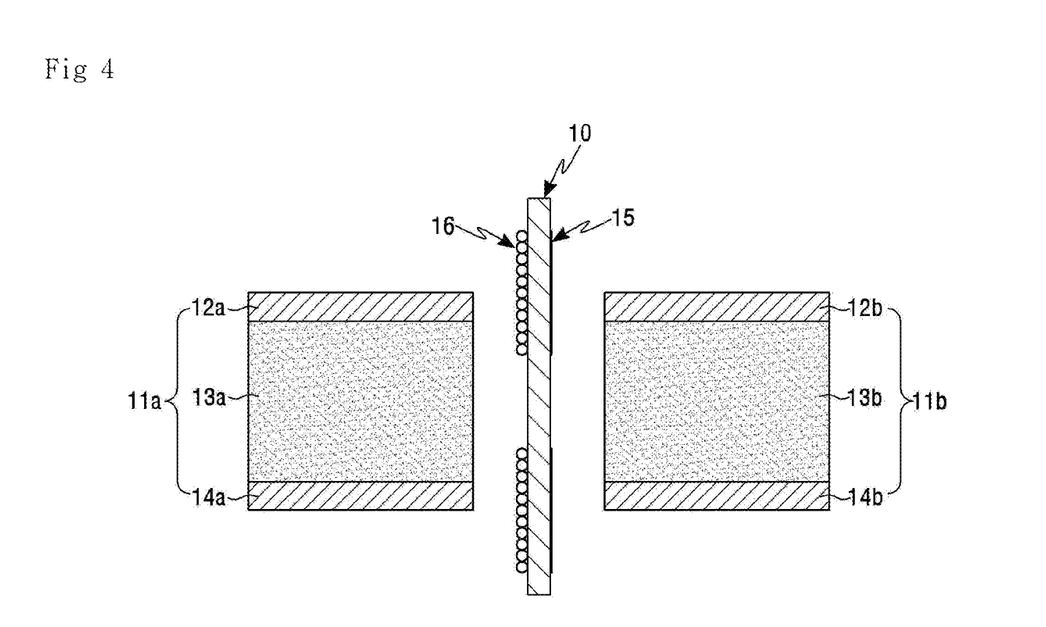
FIG. 4 is a cross-sectional view of a flat panel speaker including a hybrid movable coil plate according to the first embodiment of the present invention.

FIG. 1 is a schematic perspective view of a flat panel speaker including a hybrid movable coil plate according to a first embodiment of the present invention, FIG. 2 is a schematic perspective view of a flat panel speaker including a hybrid movable coil plate viewed from another angle according to the first embodiment of the present invention, FIG. 3 is an exploded perspective view of a copper wire coil of a flat panel speaker including a hybrid movable coil plate according to the first embodiment of the present invention, and FIG. 4 is a cross-sectional view of a flat panel speaker including a hybrid movable coil plate according to the first embodiment of the present invention.

In FIG. 3, for convenience of description and to help understand a disposition relationship, only a copper wire coil 16 is detached and disposed on a side surface of a movable coil plate 10, and the copper wire coil 16 is used by being attached to the side surface of the movable coil plate 10.

A flat panel speaker to which a movable coil plate of the present invention is applied is as illustrated in FIGS. 1 and 4. Here, a damper for applying vibration to the movable coil, a lead wire, a base frame and a vibration plate are omitted.

The flat panel speaker may be formed by including: a pair of magnetic bodies 11a and 11b; a movable coil plate 10 positioned between the pair of magnetic bodies 11a and 11b; and a vibration plate (not shown) positioned on the upper end of the movable coil plate 10.

The pair of mutually facing magnetic bodies 11a and 11b may have the same configuration and may be composed of: magnets 13a and 13b; upper yokes 12a and 12b positioned on the upper surfaces of the magnets 13a and 13b; and lower yokes 14a and 14b positioned on the lower surfaces of the magnets 13a and 13b.

The magnets 13a and 13b provided inside the magnetic bodies 11a and 11b have reverse polarities so that an attractive force acts therebetween, and the movable coil plate 10 favorably maintains the same distance from the magnetic bodies so as to receive the same magnetic force from both-side magnetic bodies 11a and 11b.

The speaker configured as such is attached inside a base frame (not shown), and a vibration plate (not shown) for transmitting vibration energy to the upper end of a movable coil film 10 may be formed.

The upper yokes 12a and 12b, the lower yokes 14a and 14b, and magnets 13a and 13b may each composed of a single plate that is not separated.

The magnets 13a and 13b may be integrally formed with the upper yokes 12a and 12b and the lower yokes 14a and 14b and be prevented from being bent inward due to the attractive forces of N and S poles.

A PCB coil 15 pattern-printed on a printed circuit board (PCB) may be printed on one surface of the movable coil plate 10, a copper wire coil 16 wound by a copper wire is adhered to the other surface, and each of the surfaces may be formed in a track type.

The PCB coil 15 may be pattern-printed on the PCB or formed through exposure or etching, and the copper wire coil 16 may be formed in a form in which a copper wire is spirally wound on a separate winding bobbin and this is adhered to the movable coil plate 10.

The present invention is referred to as a hybrid movable coil plate because as described above, the PCB coil 15 is formed on one surface of the movable coil plate 10 and a copper wire coil 16 is formed on the other surface and the two coils are electrically connected.

The hybrid movable coil plate 10 according to the present invention can be said to be innovative as a structure that overcomes disadvantages of a case of being composed of only the PCB coil and the copper wire coil and combines only advantages.

The hybrid movable coil plate 10 according to the present invention completely solves the limitation of a copper wire coil, which is wound in a planar track type by a typical copper wire and attached to a bobbin, combines the merits of the typical copper wire coil and a PCB coil pattern-printed on a PCB, and thus may complete a movable coil plate for flat panel speakers which is more efficient and has functionally excellent concept.

In case of a planar track-like copper wire coil wound by a typical copper wire, there is difficulty in electrically connecting the inner and outer ends of a track. However, when applying a hybrid movable coil plate of the present invention, the difficulty may be solved, the number of turns of a track pattern-printed on a single layer or odd-numbered multilayer PCB so as to maximize an "L" value, which is very important to improve acoustic pressure, is added to the number of turns of a copper wire coil, and thus inductive electromotive force may be increased and an effect of improving the acoustic pressure of the speaker is achieved.

The PCB coil 15 and the copper wire coil 16 which are on one surface may be electrically connected by the hybrid movable coil plate 10.

The PCB coil 15 and the copper wire coil 16 are respectively formed on one and the other surfaces of the hybrid movable coil plate 10, first and second lead wire connection ends 19a and 19b are respectively formed in semicircular shapes on both upper end sides, a copper foil 18a is formed in the via hole 17a and in the vicinity of the via hole 17a at the inner start end of the PCB coil 15, and a via hole 17b and a copper foil 18b are formed on one lower end of the hybrid movable coil plate 10. Thus, the copper foil 18b and a first lead wire connection end 19a are electrically connected.

The outer end of the PCB coil 15 is connected to a second lead wire connection end 19b, the inner start end of the copper wire coil 16 is electrically connected to the copper foil 18a through the via hole 17a, and the outer end of the copper wire coil 16 is connected to the copper foil 18b through the via hole 17b.

The first and second lead wire connection ends 19a and 19b are each connected to a lead wire and connected to an external power supply.

Second Embodiment According to the Present Invention

Figure 5:
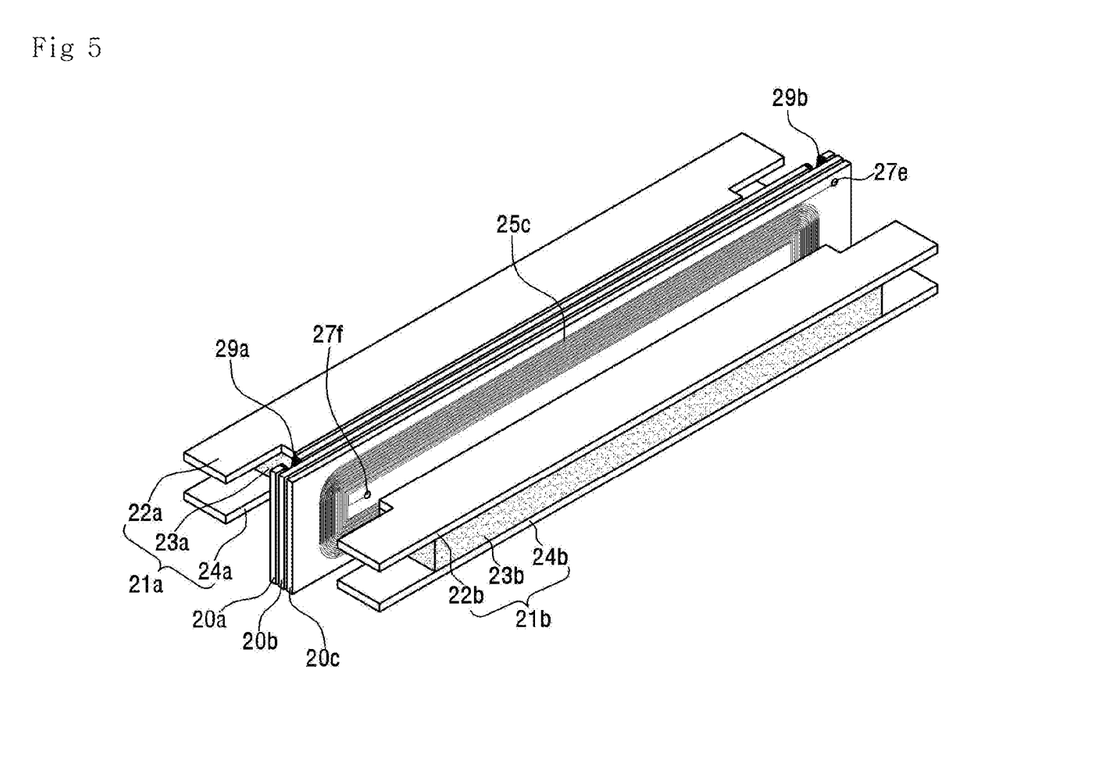
FIG. 5 is a schematic perspective view of a flat panel speaker including a hybrid movable coil plate according to a second embodiment of the present invention.
Figure 6:
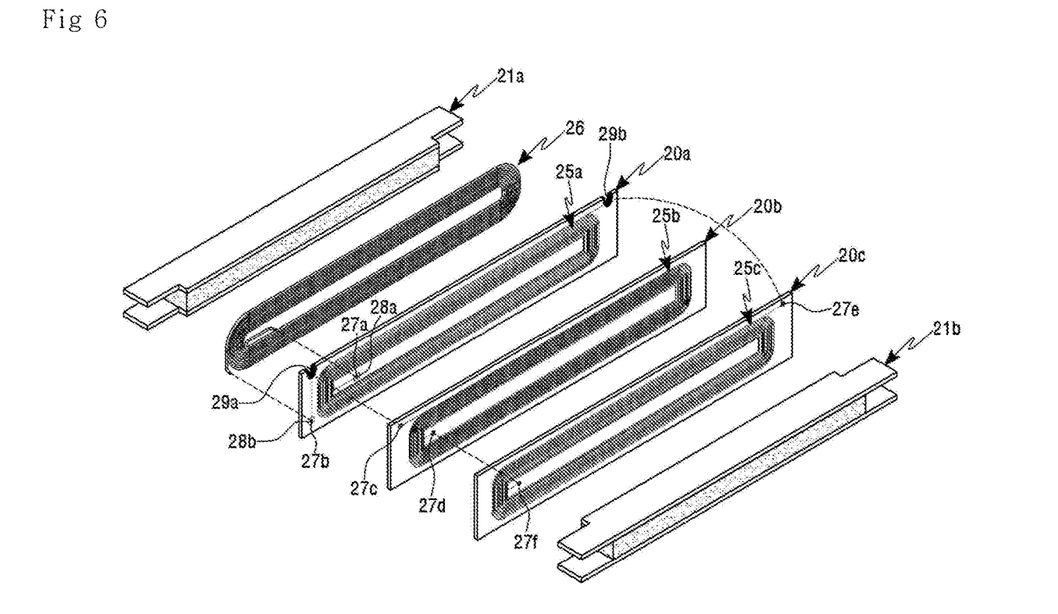
FIG. 6 is an exploded perspective view of a copper wire coil of a flat panel speaker including a hybrid movable coil plate according to the second embodiment of the present invention.
Figure 7:
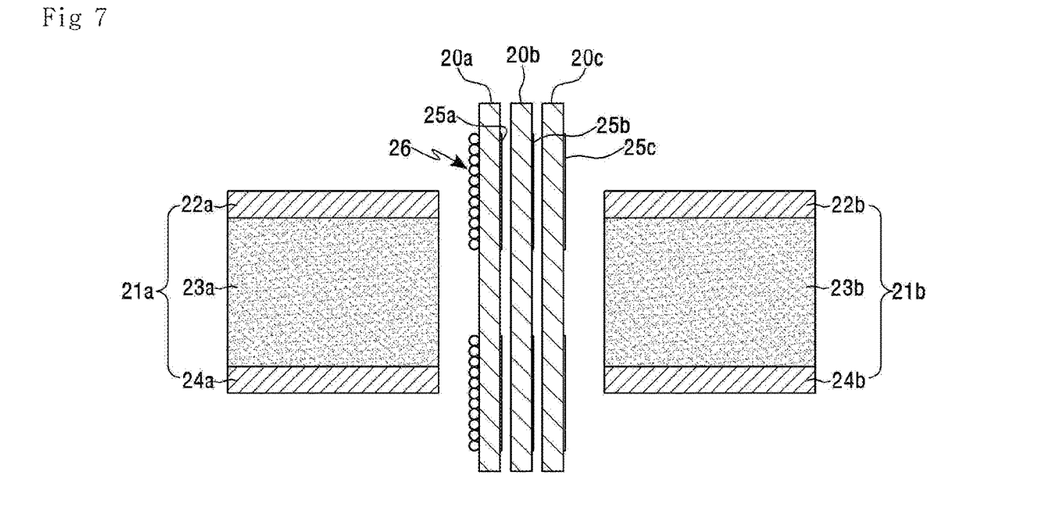
FIG. 7 is a cross-sectional view of a flat panel speaker including a hybrid movable coil plate according to the second embodiment of the present invention.

FIG. 5 is a schematic perspective view of a flat panel speaker including a hybrid movable coil plate according to a second embodiment of the present invention, FIG. 6 is an exploded perspective view of a copper wire coil of a flat panel speaker including a hybrid movable coil plate according to the second embodiment of the present invention, and FIG. 7 is a cross-sectional view of a flat panel speaker including a hybrid movable coil plate according to the second embodiment of the present invention.

In FIG. 6, for convenience of description and to help understand a disposition relationship, only a copper wire coil 26 is decomposed and disposed on a side surface of a first movable coil date 20a, and the copper wire coil 26 is used by being attached to the side surface of the first movable coil plate 20a.

Comparing the second embodiment and the first embodiment according to the present invention, a more efficient speaker is achieved by horizontally arranging the number of hybrid movable coil plates based on the same configuration.

The first embodiment of the present invention has a single hybrid movable coil plate 10, whileas the second embodiment of the present invention illustrates the structure of an odd number (2n+1, where n is an integer) of multilayer movable coil plates.

The second embodiment of the present invention describes three-layer structure movable coil plates 20a, 20b and 20c as an example, and a multilayer structure with five layers or more may also form a multilayer movable coil plate by the same principle.

As illustrated in FIGS. 5 to 7, a flat panel speaker may be formed by including: movable coil plates 20a, 20b and 20c positioned between a pair of magnetic bodies 21a and 21b; a vibration plate (not shown) positioned on the upper end of the movable coil plates; a base frame for positioning each of configurations; and a housing (not shown).

Mutually facing pair of magnetic bodies 21a and 21b may be composed of magnets 23a and 23b, upper yokes 22a and 22b, and lower yokes 24a and 24b.

The movable coil plates are composed of first movable coil plate 20a, a second movable coil plate 20b, and a third movable coil plate 20c, a copper wire coil 26 is adhered to one surface of the first movable coil plate 20a, and a first PCB coil 25a is pattern-printed on the other surface. A second PCB coil 25b is pattern-printed on the other surface of the second movable coil plate 20b, a third PCB coil 25c is pattern-printed on the other surface of the third movable coil plate 20c, and the coil is formed in a track shape.

The PCB coils 25a, 25b and 25c on one surfaces and the copper wire coil 26 may be electrically connected by the hybrid movable coil plates 20a, 20b and 20c.

The first PCB coil 25a and the copper wire coil 26 are respectively formed on one and the other surfaces of the first movable coil plate 20a, lead wire connection ends 29a and 29b are respectively formed in semicircular shapes on both upper end sides, a copper foil 28a is formed in the via hole 27a and in the vicinity of the via hole 27a at the inner start end of the PCB coil 15, and a via hole 27b and a copper foil 28b are formed on one lower left end of the first movable coil plate 20a. Thus, the copper foil 28b and a first lead wire connection end 29a are electrically connected.

The second PCB coil 25b is formed on the other surface of the second movable coil plate 20b, a via hole 27d is formed on the inner start end of the second PCB coil 25b, and a via hole 27c connected to the outer end of the second PCB coil 25b is formed on the upper left end.

The third PCB coil 25c is formed on the other surface of the third movable coil plate 20c, a via hole 27f is formed on the inner start end of the third PCB coil 25c, and a via hole 27e connected to the outer end of the third PCB coil 25c is formed on the upper right end.

In order to smoothly performing soldering of lead wires of the second movable coil plate 20b and the third movable coil late 20c, a half-moon shaped groove may be formed The outer end of the first PCB coil 25a is connected to the second lead wire connection end 29b, the inner start end of the copper wire coil 26 is electrically connected to the copper foil 28a through the via hole 27a and is thus connected to the first PCB coil 25a, and the outer end of the copper wire coil 26 is connected to the copper foil 28b through the via hole 27b and is thus electrically connected to the first lead wire connection end 29a.

The inner start end of the second PCB coil 25b and the inner start end of the third PCB coil 25c are electrically connected to each other through the via holes 27d and 27f.

The first PCB coil 25a of the first movable coil plate 20a and the copper wire coil 26 are connected in series, and the second PCB coil 25b of the second movable coil plate 20b and the third PCB coil 25c of the third movable coil plate 20c are connected in series.

The outer end of the second PCB coil 25b is connected to the first lead wire connection end 29a through the via hole 27c and connects the first movable coil plate 20a and the second movable coil plate 20b to each other in parallel.

The outer end of the third PCB coil 25c is connected to the second lead wire connection end 29b through the via hole 27e and connects the first movable coil plate 20a and the third movable coil plate 20c to each other in parallel.

The first and second lead wire connection ends 29a and 29b are each connected to a lead wire and connected to an external power supply.

Third Example According to the Present Invention

Figure 8:
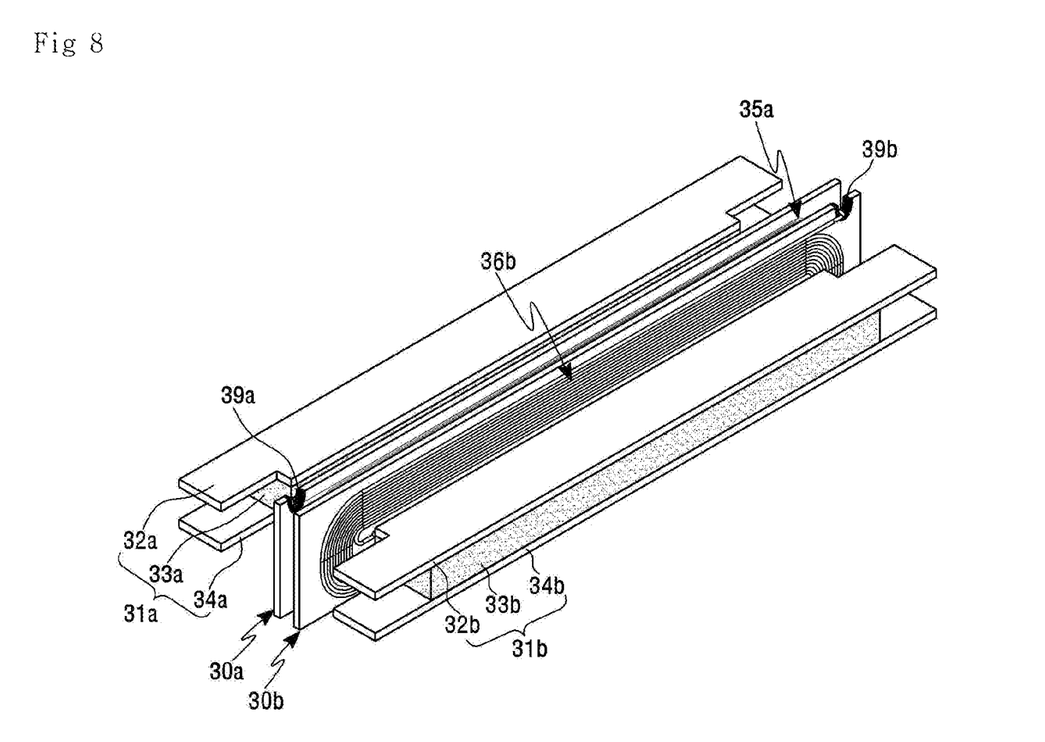
FIG. 8 is a schematic perspective view of a hybrid movable coil plate for a flat panel speaker according to a third embodiment of the present invention.
Figure 9:
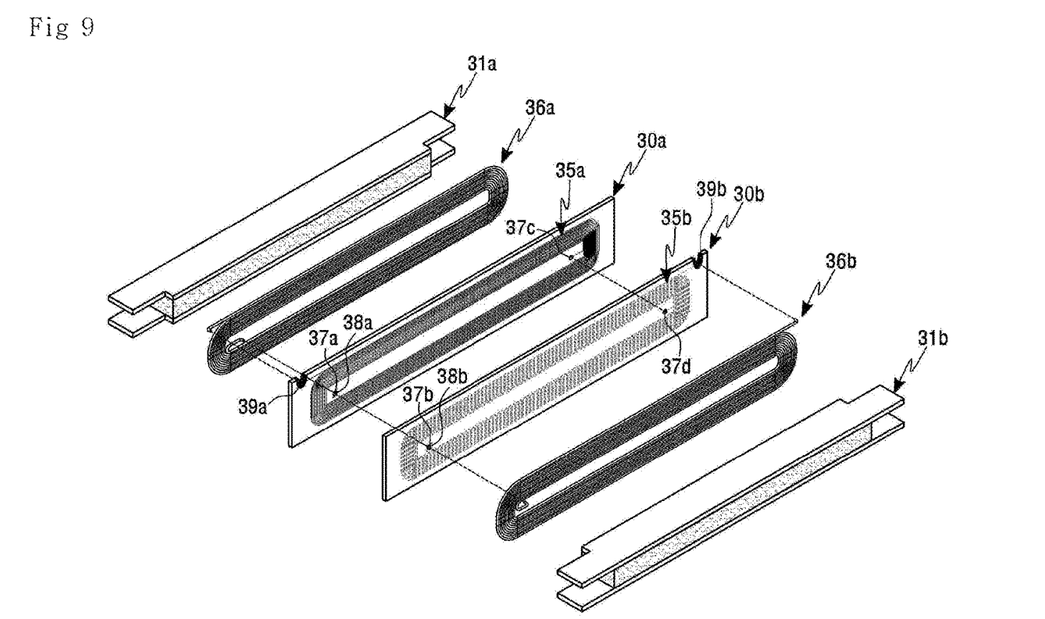
FIG. 9 is an exploded perspective view of a copper wire coil of a flat panel speaker including a hybrid movable coil plate according to the third embodiment of the present invention.
Figure 10:
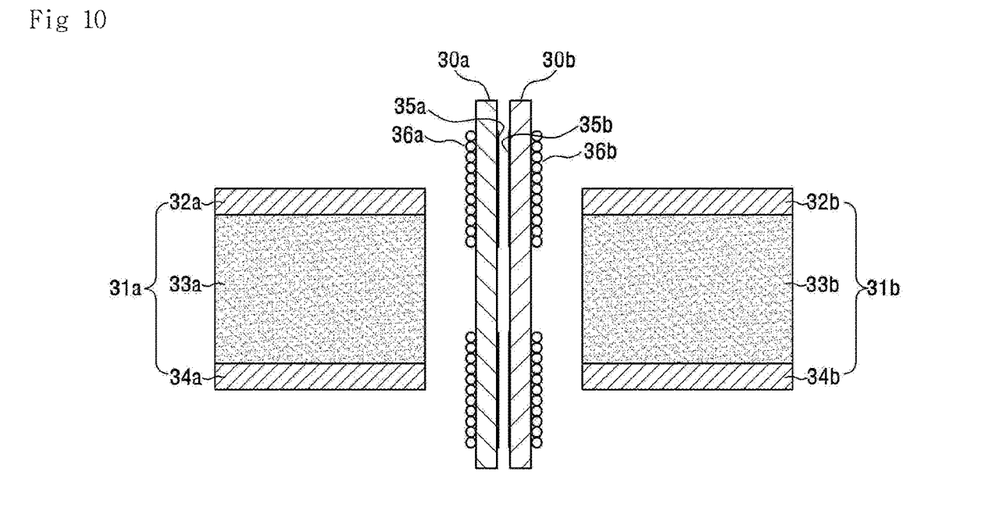
FIG. 10 is a cross-sectional view of a flat panel speaker including a hybrid movable coil plate according to the third embodiment of the present invention.

FIG. 8 is a schematic perspective view of a movable coil plate for flat panel speakers according to a third embodiment of the present invention, FIG. 9 is an exploded perspective view of a copper wire coil of a flat panel speaker including a hybrid movable coil plate according to the third embodiment of the present invention, and FIG. 10 is a cross-sectional view of a flat panel speaker including a hybrid movable coil plate according to the third embodiment of the present invention.

In FIG. 9, for convenience of description and to help understand a disposition relationship, only copper wire coils 36a and 36b are decomposed and disposed on a side surface of a first movable coil plate 30a, and the copper wire coils 36a and 36b are used by being respectively attached to the side surfaces of the first and second movable coil plates 30a and 30b.

Comparing the third example and the first example according to the present invention, a more efficient speaker is achieved by horizontally arranging the number of hybrid movable coil plates on the basis of the same configuration.

The first embodiment of the present invention has a single hybrid movable coil plate 10, whileas the third embodiment illustrates the structure of an even number (2n, where n is an integer) of multilayer movable coil plates.

The third embodiment of the present invention illustrates two-layer structure movable coil plates 30a and 30b as an example, and a multilayer structure of four or more layers may form a multilayer structure movable coil plate on the basis of the same principle.

As illustrated in FIGS. 8 to 10, a flat panel speaker may be formed by including: movable coil plates 30a and 30b positioned between a pair of magnetic bodies 31a and 31b; a vibration plate (not shown) positioned on the upper ends of the movable coil plates; a base frame for positioning each of configurations; and a housing (not shown).

Mutually facing pair of magnetic bodies 31a and 31b may be composed of magnets 33a and 33b, upper yokes 32a and 32b, and lower yokes 34a and 34b.

The movable coil plates are composed of first movable coil plate 30a and a second movable coil plate 20b, a first copper wire coil 26 is adhered to one surface of the first movable coil plate 30a, and a first PCB coil 35a is pattern-printed on the other surface. The second PCB coil 35b is pattern-printed on one surface of the second movable coil plate 30b, a second copper wire coil 36b is attached to the other surface, and the coils are each formed in a track shape.

The PCB coils 35a and 35b and the copper wire coils 36a and 36b may be electrically connected by the hybrid movable coil plates 30a and 30b.

The first copper wire coil 36a and the first PCB coil 35a are respectively formed on one and the other surfaces of the first movable coil plate 30a, a first lead wire connection end 39a is formed in a half-moon shape on one side (left side) of the upper end of the first movable coil plate, a via hole 37c is formed in the inner start end of the first PCB coil 35a, a copper foil 38a is formed in a via hole 37a and in the vicinity of the via hole 37a on the inner side, and the outer end of the first movable coil plate 30a is connected to the first lead wire connection end 39a.

A second PCB coil 35b and a second copper wire coil 36b are respectively formed on one and the other surfaces of the second movable coil plate 30b, a second lead wire connection end 39b is formed in a half-moon shape on the other side (right side) of the upper end of the first movable coil plate, a via hole 37d is formed in the inner start end of the second PCB coil 35b, a copper foil 38b is formed in a via hole 37b and in the vicinity of the via hole 37b on the inner side, and the outer end of the second movable coil plate 30b is connected to the second lead wire connection end 39b.

Here, the copper foils 38a and 38b are not electrically connected to the first and second PCB coils 35a and 35b.

The first and second PCB coils 35a and 35b are connected to each other at the inner start ends thereof through the via holes 37c and 37d.

The inner start end of the first copper wire coil 36a passes through the via holes 37a and 37b and are connected to the copper foil 38b in parallel, and the electrical connection between the PCB coils should not be present here.

The first lead wire connection end 39a is electrically connected to the outer end of the first copper wire coil 36a, and the second lead wire connection end 39b is electrically connected to the outer end of the second copper wire coil 36b.

The first and second lead wire connection ends 39a and 39b are each connected to a lead wire and connected to an external power supply.

On the left and right sides of the first and second movable coil plates, half-moon like grooves having the same shape as the lead wire connection ends may also be formed on the reverse side, in which lead wire connection ends are not formed.

Example of Magnetic Circuit Structure Using the

First Embodiment According the Present Invention

Figure 11:
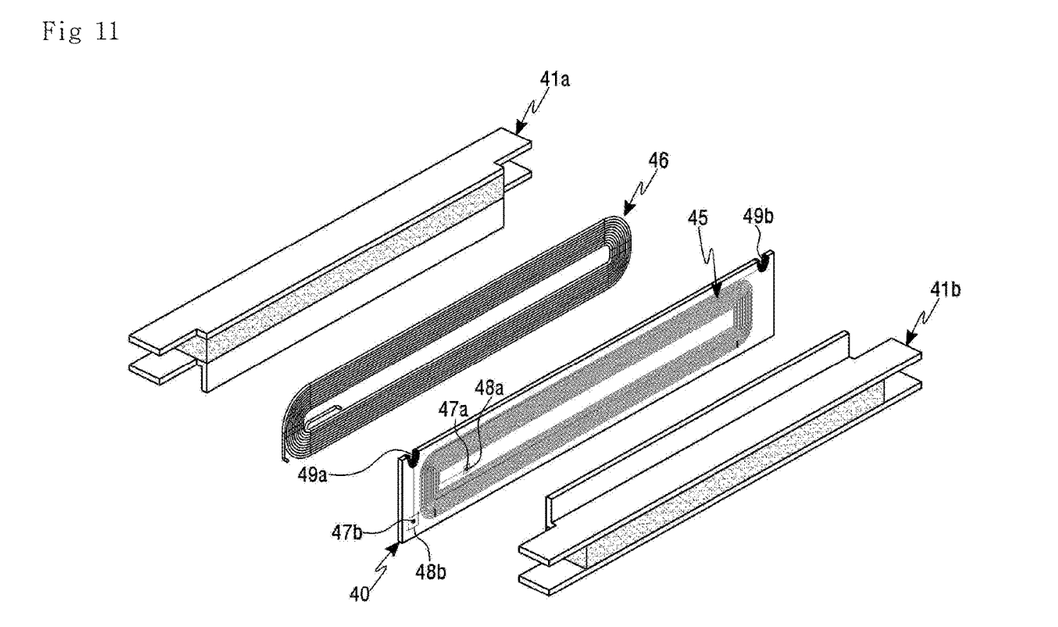
FIG. 11 is a schematic perspective view of a flat panel speaker including a magnetic circuit structure using the first embodiment of the present invention.
Figure 12:
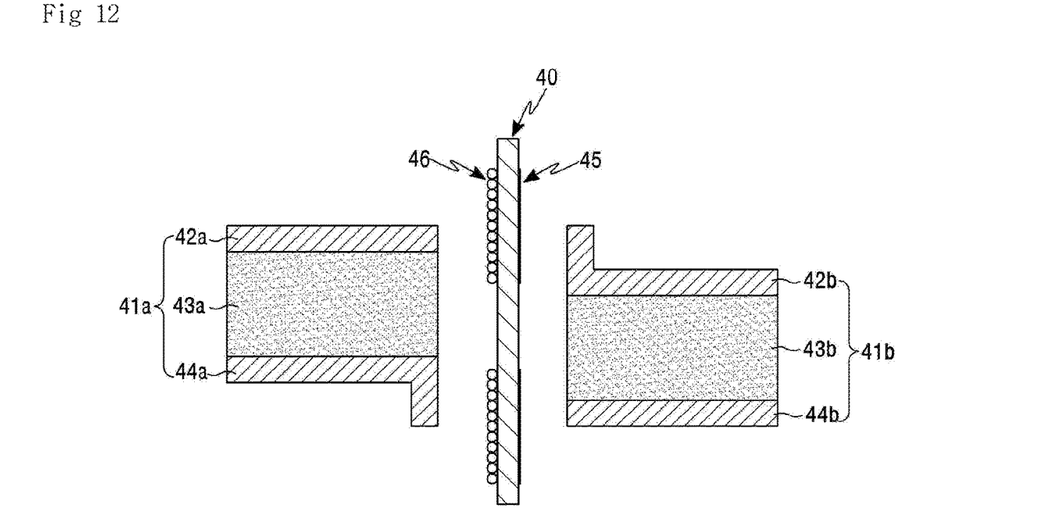
FIG. 12 is a cross-sectional view of a flat panel speaker including magnetic circuit structure using the first embodiment of the present invention.

FIG. 11 is a schematic perspective view of a flat panel speaker including a magnetic circuit structure using the first embodiment of the present invention, and FIG. 12 is a cross-sectional view of a flat panel speaker including a magnetic circuit structure using the first embodiment of the present invention.

The drawings illustrated in FIGS. 11 and 12 illustrate an example in which a flat panel speaker is implemented using a hybrid movable coil plate proposed by the present invention, and the structure of a magnetic circuit is modified to prevent an inverse magnetic field.

Magnetic circuits of general flat panel speakers or magnetic circuits illustrated in first to third embodiments of the present invention are as illustrated in FIGS. 1 to 10.

Upper yokes and lower yokes each have a flat plate shape, a magnet is positioned therebetween, and the upper yokes and the lower yokes have structures of being respectively positioned at the upper and lower coil positions in track-like coils.

At this point, a magnetic field always flows from the N pole to S pole, and the magnetic field starting at the N pole is adhered to the closest S pole.

Unlike the magnetic circuits of general speakers, in the movable coil applied to a track-shape flat panel speaker, upper end and lower end coil tracks should be present in the movable coil, and yokes for N and S poles should be correctly positioned corresponding to the upper end and lower end coil tracks.

In case of the magnetic circuits illustrated in FIGS. 1 to 10, when the magnets and yokes for the N and S poles are symmetrical in the positive direction and has a large amplitude, the gap between the upper end coil track and the lower end coil track is narrow and a reverse direction magnetic field is applied to the inner track coil end that has been moved by the amplitude, and thus, the efficiency of vertical vibration is degraded or it is difficult to ensure sufficient amplitude and there is a limit in low-frequency sound playback.

To solve such limitations, magnetic circuits such as illustrated in FIGS. 11 and 12 may be constructed.

A pair of magnetic bodies 41a and 41b and a movable coil plate 40 spaced apart a certain equal distance from each other are positioned. Here, the movable coil plate 40 is exemplarily described to have the same structure as illustrated in FIGS. 1 and 4.

The first and second magnetic bodies 41a and 41b are respectively composed of magnets 43a and 43b, upper yokes 42a and 42b, and lower yokes 44a and 44b.

Here, the upper yoke 42a of the first magnetic body is formed in a flat panel shape, the lower yoke 44a has a shape in which a tip side (mean a portion positioned on the movable coil plate side) is bent downward about 90 degrees, the lower yoke 44b of the second magnetic body is formed in a flat panel shape, and the upper yoke 42b has a shape in which a tip side (mean a portion positioned on the movable coil plate side) is bent upward by about 90 degrees.

That is, since the polarities of the upper and lower yokes of the first magnetic body and the polarities of the upper and lower yokes of the second magnetic body are reverse to each other, when the upper and lower yokes of the first magnetic body have N and S poles respectively, the upper and lower yokes of the second magnetic body have S and N poles respectively.

Thus, when the yoke for the N pole has a flat panel shape, the yoke for the S pole may have an inverted 'L' shape, and conversely, when the yoke for the N pole has an inverted "L" shape, the yoke for the S pole may have a flat panel shape ('−' shape).

Consequently, when the upper and lower yokes (N and S poles) have flat panel shapes, an amplitude decreases due to an inverse magnetic field, and in order to improve the limitation, there is a problem of enlarging the entire magnetic circuit. However, when the yokes having the same polarity have shapes bent upward and downward by about 90 degrees, the amplitude of the magnetic circuit increases and the limitations is solved, and it is possible to construct a magnetic circuit for preventing inverse magnetic field due to an amplitude.

Features, structures, and effects described in the above embodiments are incorporated into at least one embodiment of the present disclosure, but are not limited to only one embodiment. Moreover, features, structures, and effects exemplified in embodiments can easily be combined and modified for another embodiment by those skilled in the art. Therefore, these combinations and modifications should be construed as falling within the scope of the present disclosure.

In addition, although embodiments have mainly been described, it will be understood that the embodiments do not limit the present invention, and various modifications and applications that are not exemplified so far may be devised by those skilled in the art without departing from fundamental characteristics of the embodiments. For example, each of components specifically described in examples may be implemented with modification. In addition, differences related to variations and modifications should be construed to be within the scope of the present invention defined in appended claims.

DESCRIPTION OF SYMBOLS 10, 20a, 20b, 20c, 30a, 30b, 40 Movable coil plate
11a, 11b, 21c, 21b, 31a, 31b, 41a, 41b Magnetic body
12a, 12b, 22a, 22b, 32a, 32b, 42a, 42b Upper yoke
13a, 13b, 23a, 23b, 33a, 33b, 43a, 43b Magnet
14a, 14b, 24a, 24b, 34a, 34b, 44a, 44b Lower yoke
15, 25a, 25b, 25c, 35a, 35b, 45 PCB coil
16, 26, 36a, 36b, 46 Copper wire coil

The invention claimed is:

1. A hybrid movable coil plate for a flat panel speaker, comprising:
   a spirally wound copper wire coil attached on one surface thereof; and
   a PCB coil pattern-printed on the other surface thereof, whereby coils having mutually different structures are formed on both the surfaces thereof, wherein:
   the copper wire coil and the PCB coil are formed in track shapes;
   a pair of lead wire connection ends are formed; and copper foils are formed in one or more via holes for electrical connection between the copper wire coil and the PCB coil, and in the vicinity of at least one among the one or more via holes, wherein:
      an inner start end of the copper wire coil is connected to an inner start end of the PCB coil through the via hole, and the outer end of the copper wire coil is electrically connected to the copper foil positioned on one side surface through the via hole;
      the outer end of the PCB coil is connected to one lead wire connection end; and
      a copper plate positioned on the one side surface is connected to the other lead wire connection end.

2. A flat panel speaker comprising a hybrid movable coil plate of claim 1.

3. A flat panel speaker comprising a hybrid movable coil plate of claim 1, wherein:
   a pair of magnetic bodies spaced apart a predetermined distance from each other are positioned on both sides of the movable coil plate;
   the pair of magnetic bodies each comprise a magnet, an upper yoke positioned on an upper surface of the magnet, and
   a lower yoke positioned on a lower surface of the magnet; and one of the upper yoke or the lower yoke has a flat plate shape, and the other has a bent shape bent about 90 degrees at a position facing the movable coil plate.

4. A hybrid movable coil plate for a flat panel speaker, comprising:
   2n+1 layers, wherein n is a positive integer;
   a copper wire coil having a spirally wound track shape attached on one surface of 2n−1th movable coil plate; and
   a PCB coil pattern printed in a track shape on the other surface thereof, whereby coils having mutually different structures are formed on both the surfaces thereof, wherein:
   a pair of lead wire connection ends are formed on upper end both sides of the 2n−1th movable coil plate;
   copper foils are formed in one or more via holes for electrical connection between the copper wire coil and the PCB coil and in the vicinity of the one or more via holes;
   and a 2n-th movable coil plate comprises a PCB coil pattern-printed in a track shape on the other surface thereof and one or more via holes.

5. The hybrid movable coil plate for a flat panel speaker of claim 4, wherein:
   the inner start end of the copper wire coil of the 2n−1th movable coil plate is electrically connected to the inner start end of the PCB coil through the via hole, and the outer end of the copper wire coil is electrically connected to a copper plate positioned on one side surface through the via hole;
   an inner start end of each of the PCB coils of the 2n-th movable coil plate is connected through the via hole, and an outer end thereof is connected through another via hole;

one lead wire of the 2n−1th movable coil plate and an outer end of the 2n+1th movable coil plate are commonly connected, and the other lead wire of the 2n−1th movable coil plate and an outer end of the 2n-th movable coil plate are commonly connected; and an outer end of the PCB coil of the 2n−1th movable coil plate is connected to one lead wire connection end, and a copper plate positioned on the one side surface is connected to the other lead wire connection end.

6. A hybrid movable coil plate for a flat panel speaker, comprising:

2n layers, wherein n is a positive integer;

a copper wire coil having a spirally wound track shape attached on one surface of each of movable coil plates; and a PCB coil pattern-printed in a track shape on the other surface thereof, whereby coils having mutually different structures are formed on both the surfaces thereof, wherein a pair of mutually facing movable coil plates each comprise:

a single lead wire connection end formed therein;

a single via hole on the inner side thereof provided so that the PCB coil is connected thereto; and another via hole and a copper foil formed on the inner side thereof so that a pair of mutually facing copper wire coils are connected through the another via hole and the copper foil.

7. The hybrid movable coil plate for a flat panel speaker of claim 6, wherein:

a pair of mutually facing movable coil plates are each connected with the inner start end of the PCB coil;

the inner start ends of the copper wire coils are connected to each other through the via hole and the copper plate; and an outer end of the 2n−1th movable coil plate is commonly connected to one lead wire connection end, and an outer end of 2n-th movable coil plate is commonly connected to the other lead wire connection end.

* * * * *